(12) United States Patent
Saini et al.

(10) Patent No.: US 7,370,310 B1
(45) Date of Patent: May 6, 2008

(54) STATIC ADDRESS MAPPING

(75) Inventors: Milan R. Saini, Palo Alto, CA (US);
Jibin Han, Albuquerque, NM (US)

(73) Assignee: XILINX, Inc., San Jose, CA (US)

( * ) Notice: Subject to any disclaimer, the term of this patent is extended or adjusted under 35 U.S.C. 154(b) by 317 days.

(21) Appl. No.: 11/200,454

(22) Filed: Aug. 8, 2005

(51) Int. Cl.
*G06F 17/50* (2006.01)
*H03K 17/693* (2006.01)

(52) U.S. Cl. .............................. 716/16; 716/4; 716/17; 716/18

(58) Field of Classification Search .................... 716/4, 716/16–18; 711/202–209, 211, 217, 218
See application file for complete search history.

(56) References Cited

U.S. PATENT DOCUMENTS 6,148,377 A * 11/2000 Carter et al. ................ 711/147
6,467,009 B1 * 10/2002 Winegarden et al. ....... 710/305
6,754,882 B1 * 6/2004 Sanchez et al. .............. 716/16
6,959,428 B2 * 10/2005 Broberg et al. .............. 716/18

* cited by examiner

*Primary Examiner*—Jack Chiang
*Assistant Examiner*—Nghia M. Doan
(74) *Attorney, Agent, or Firm*—W. Eric Webostad

(57) ABSTRACT

Address map generation is described. More particularly, static addresses are obtained. A system design at least a portion of which is for instantiation in configurable logic of an integrated circuit is obtained. The system design includes a processor. At least one predefined circuit block in the design is identified as a peripheral connected to a processor. The at least one predefined circuit block is for instantiation in the configurable logic of the integrated circuit. Assigned to the at least one predefined circuit block is a static address range which is obtained from the static addresses. An address map for the design is generated having the at least one predefined circuit block with the static address range. Thus, for example, independent designers designing separate systems having a same set of peripherals may map to the same static address ranges independent of software system builder tool version, board, or processor used.

11 Claims, 15 Drawing Sheets

STATIC ADDRESS MAPPING

FIELD OF THE INVENTION

One or more aspects of the invention generally relate to integrated circuits and, more particularly, to mapping of static addresses for coupling circuit blocks to a processor via one or more buses for an integrated circuit having configurable logic.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation. One such FPGA, the Xilinx Virtex® FPGA, is available from Xilinx, Inc., 2100 Logic Drive, San Jose, Calif. 95124.

Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, an embedded microprocessor may be located in an area reserved for it, generally referred to as a "processor block."

Heretofore, a software tool used to instantiate a processor-based design in a PLD, such as an FPGA, assigned address ranges for coupling circuit blocks ("peripherals") to a processor, such as with an embedded or instantiated processor, on a random basis subject to availability. Accordingly, if a design was changed, then on a subsequent instantiation of the design in a PLD, the address ranges would be reassigned by such software tool. Conventionally, this meant that one or more of the address ranges would change from an initial instantiation of a design to an instantiation of a revision of the design. This variability is a consequence of the flexibility of the PLD platform. However, such variability, especially when not used by a user, makes the task of managing designs more complex and error prone as each instantiation could have different addressing of peripherals. It should be understood that heretofore two identical systems which would be independently designed may yield different address maps for coupling to a bus or buses. Such variability was dependent on the particular PLD platform, the Embedded Developer Kit ("EDK") software tool or tools, or the printed circuit board ("PCB"). As is well-known, a microprocessor accesses memory and I/O via addresses. For a microprocessor to access memory or an I/O device, conventionally such microprocessor places an address for the device on an address bus coupled to the device, along with a read or write instruction on a control bus for the device In contrast to a system-on-chip implementation in a PLD, an Application Specific Integrated Circuit ("ASIC") or Application Specific Standard Product ("ASSP") dedicated system-on-chip integrated circuits with built in peripherals, such as a PowerPC 405GP from International Business Machines ("IBM")" of New York for example, have addresses that are fixedly assigned by the manufacturer.

Accordingly, it would be desirable and useful to provide means that facilitate yielding a same address map for similarly situated peripherals of same or different systems regardless of the EDK software version used, PLD used, or PCB used, or any combination thereof, for instantiation of a system design on a PLD.

SUMMARY OF THE INVENTION

One or more aspects of the invention generally relate to integrated circuits and, more particularly, to mapping of static addresses for coupling circuit blocks to a processor via one or more buses for an integrated circuit having programmable logic such as configurable logic.

An aspect of the invention is a method for generating an address map. The method includes: obtaining static addresses; obtaining a system design for implementation in an integrated circuit, where the system design includes a processor internal to the integrated circuit; identifying at least one predefined circuit block in the system design, where the at least one predefined circuit block is for instantiating in the configurable logic of the integrated circuit for coupling to the processor; assigning to the at least one predefined circuit block a static address range for the processor to address the at least one predefined circuit block, where the static address range obtained is from the static addresses; and generating the address map for the design having the at least one predefined circuit block with the static address range.

Another aspect of the invention is a method for generating system files for instantiating a system design in an integrated circuit having configurable logic. The method includes: selecting a programmable logic device platform; selecting a processor; setting at least one processor parameter for the processor selected; selecting peripherals to be coupled to the processor selected for each of a plurality of interfaces, where the peripherals are to be instantiated in the configurable logic; obtaining static addresses; respectively assigning static address ranges of the static addresses to the peripherals; and generating an address map responsive to the static address ranges for the processor to address the peripherals, where the peripherals and the processor are internal to the integrated circuit.

Yet another aspect of the invention is a method for address mapping a circuit block for instantiation in an integrated circuit having configurable logic. The method includes: obtaining a user designed system; identifying at least one predefined circuit block in the user designed system for instantiating in the configurable logic for coupling to a microprocessor, where the microprocessor and the at least one predefined circuit block are internal to the integrated circuit as part of the user designed system; and assigning a predefined static address range associated with the at least one predefined circuit block for the microprocessor to address the at least one predefined circuit block.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIGS. 6A, 6B, 6C-1, 6C-2, 6D, and 6E are respective screen-capture diagrams depicting exemplary embodiments of Base System Builder (a component of Xilinx Platform Studio) graphical user interface ("GUI") that may be used in association with the design flow of FIG. 5.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
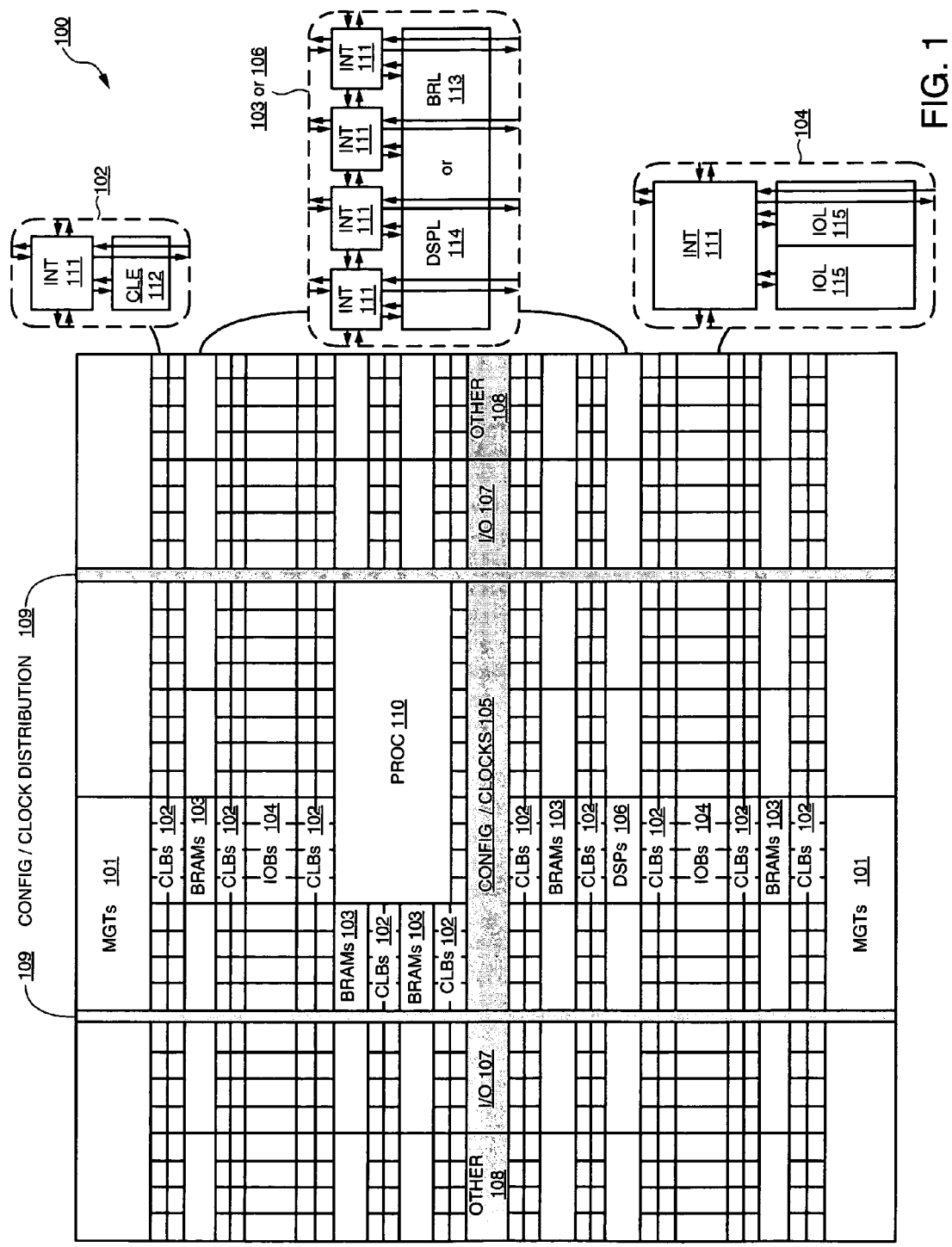
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. FPGA 100 may be used to implement system 100 of FIG. 1.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx, Inc. of San Jose, Calif.

Figure 2:
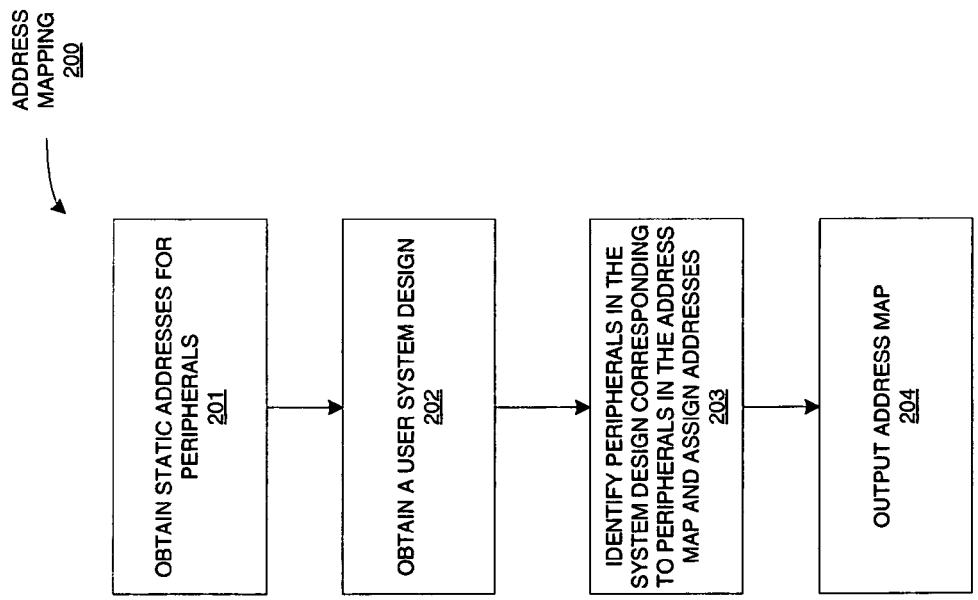
FIG. 2 is a flow diagram depicting an exemplary embodiment of an address mapping flow.

FIG. 2 is a flow diagram depicting an exemplary embodiment of an address mapping flow 200. Address mapping flow 200 at 201 obtains a listing of static addresses for peripherals. By "peripherals," it is meant any predefined or user-defined block of circuitry that may be coupled to a processor. Such blocks of circuitry may be predefined by a manufacturer or defined by a user, or any combination thereof. In the following, a Virtex-4 FPGA available from Xilinx, Inc. of San Jose, Calif. having a Power PC 405 core embedded therein is used as an example implementation. However, it shall be appreciated from the following example that other types of FPGAs, as well as other types of embedded processors, may be used. Furthermore, it should be appreciated that a software-instantiated processor, such as a Micro Blaze processor available from Xilinx, Inc. of San Jose, Calif., may be used rather than a "hard" embedded processor. Thus, in the following example, both embedded ("hard") and software-instantiated ("soft") types of processors internal to an FPGA are described.

The static addresses obtained at 201 may be from a text document listing addresses, namely a base address and a high address for up to a positive integer number, n, of instances of a peripheral which may be coupled to a particular processor via a system bus. For example, in the category of peripherals that may be coupled to a processor local bus ("PLB"), there may be base and high addresses for a number of instances of general purpose input/output interfaces ("GPIOs"). An example of a portion of such a listing in the aforementioned text document is provided:

```
BEGIN plb_gpio
  PARAMETER C_BASEADDR=
  0x80000000,0x80020000,0x80040000,0x80060000,
    0x80080000,0x800A0000,0x 800C0000,
  0x800E0000,0x80100000,0x80120000,0x80140000,
    0x80160000,0x80180000,0x 801A0000,
  0x801C0000,0x801E0000,
  PARAMETER C_HIGHADDR=
  0x8000FFFF,0x8002FFFF,0x8004FFFF,0x8006FFFF,
    0x8008FFFF,0x800AFFFF, 0x800CFFFF,
  0x800EFFFF,0x8010FFFF,0x8012FFFF,0x8014FFFF,
    0x8016FFFF,0x8018FFFF, 0x801 AFFFF,
  0x801 CFFFF,0x801 EFFFF,
END
```

Notably, an example of multiple static address ranges for multiple instances of the same type of peripheral is described below with reference to FIG. 7.

A PLB in this example represents a specific bus arbitration protocol that facilitates communication between a processor and I/O and memory devices coupled thereto. The PLB protocol in this example is part of the Coreconnect bus specification from IBM. Thus, for a first instance of a GPIO to be coupled to the PLB in the above example, address 0x80000000 to address 0x8000FFFF in hexadecimal may be used as a respective base address and high address for accessing such first GPIO instance, and for a second instance of a GPIO to be coupled to the PLB in the above example, address 0x80020000 to address 0x8002FFFF in hexadecimal may be used as a respective base address and high address for accessing such second GPIO instance. Though particular addresses are shown in the above example, it should be understood that other base and high address pairs may be used. Furthermore, though there are 16 base address and high address pairs in the above example, fewer or more address pairs may be used. In an embodiment, PLB predefined peripherals, PLB user-defined peripherals, on-chip processor bus ("OPB") predefined peripherals, OPB user-defined peripherals, device control register ("DCR") predefined peripherals, and DCR user-defined peripherals may have associated therewith specific base and high address pairs. For example, PLB predefined peripherals may include, in addition to GPIOs, Universal Asynchronous Receiver Transmitters ("UARTs"), Gigabit Ethernet Media Access Controllers ("GEMACs"), Asynchronous Transfer Mode Controllers ("ATMCs"), Rapid I/O Low Voltage Differential Signaling ("Rapid I/O LVDS") interfaces, double data rate ("DDR") interfaces, and External Memory Controllers ("EMCs"), among other known PLB predefined peripherals.

Moreover, a number of user-created peripherals may be provided for by identifying static addresses, namely base and high address pairs, for each of one or more user-defined peripherals designed to be coupled to a bus, such as the PLB for example. These may be identified as custom peripherals 0 through some number, for example, 127, to provide 128 different possible types of peripherals that may be coupled to a PLB. Notably, the number of base and address pairs may be 16 for each possible type of user-defined PLB peripheral. Of course, fewer or more static addresses may be associated with each type of user-defined peripheral, and fewer or more than 128 types of user-defined peripherals may be allocated.

An OPB in this example represents a communication protocol that facilitates communication between a processor and I/O and memory devices. The OPB protocol in this example is part of the Coreconnect bus specification from IBM. Predefined peripherals in such an address map may include GPIOs, Hard Wired Internal Configuration Access Ports ("HWICAPs"), UARTs, UART Lites, inter-integrated circuit bus ("IIC") interfaces, Serial Peripheral Interfaces ("SPIs"), Ethernets, Ethernet Lites, ATMCs, Interrupt Controllers ("INTCs"), Microprocessor Debug Modules ("MDMs"), EMCs, System Advanced Configuration Environments ("System ACEs"), time-base watchdog timers ("WDTs"), timers, Direct Memory Address ("DMA") interfaces, delta sigma analog-to-digital converters ("ADCs"), delta sigma digital-to-analog converters ("DACs"), System Monitor ADCs, Peripheral Component Interconnects ("PCIs"), PCI arbiters, V20 OPB interfaces, OPB-to-PLB bridges, JTAG UARTS, OPB arbiters, and High-Level Data Link Controllers ("HDLCs"), among other known OPB predefined peripherals.

Continuing the above example, OPB user-defined peripherals may provide for 128 possible types identified as OPB custom 0 through 127, where each type is allotted 16 base and high address pairs. Accordingly, as indicated above with respect to user-defined PLB peripherals, fewer or more than 128 types of user-defined OPB peripherals may be allotted, and fewer or more than 16 address pairs for each type may be allotted.

An address map text document may include device control register ("DCR") peripherals. In this example, a DCR represents a protocol that facilitates communication between a processor and I/O and memory devices. The DCR protocol in this example is part of the Coreconnect bus specification from IBM. Examples of such DCR predefined peripherals include an instruction-side on-chip memory controller ("ISOCM"), a data-side on-chip memory controller ("DSOCM"), a PLB-to-OPB bridge, an OPB-to-PLB bridge, a V34 PLB interface, an instruction-side DCR interface, and a DCR INTC. Notably, there may be more than one Power PC core. Furthermore, user-defined peripherals for coupling to a DCR bus may be allotted address space. For example, there may be allotted four types of peripherals, each with two base and high address pairs, for coupling user-defined peripherals to a DCR. Notably, fewer or more types, as well as fewer or more than two base and high address pairs for each type may be used subject to any limitation imposed with respect to the particular processor, such as a Power PC 405 core. However, in order to provide continuity across multiple platforms, a limited number of DCR peripheral types, as well as addresses, may be allocated, for embedded Power PC cores.

At 202, a user system design is obtained. At 203, the user system design is compared with the listing of static addresses obtained at 201. One or more peripherals in the user system design obtained at 202 are identified as being in the address map obtained at 201, and a base address and a high address are assigned to each such peripheral identified at 203. Notably, these one or more peripherals are to be instantiated and coupled to a processor in configurable logic of the FPGA as part of instantiation of the user's system design. At 204, an address map associated with the peripherals in the user system design obtained at 202 may be output.

Notably, at 203, responsive to a user selecting a functional equivalence option such as may be provided for selection via a switch of a user interface of a software tool for system configuration, peripherals that functionally are equivalent though have separate versions for each bus may be assigned the same static address. For example, responsive to a user invoking the functional equivalence option, an Ethernet peripheral, which may reside on an OPB or a PLB, is assigned one static address or set of static addresses for both the OPB version and the PLB version of the Ethernet peripheral. Thus, in this example, the default of having an OPB Ethernet peripheral version having a different static address than a PLB Ethernet peripheral version is overridden.

Figure 3:
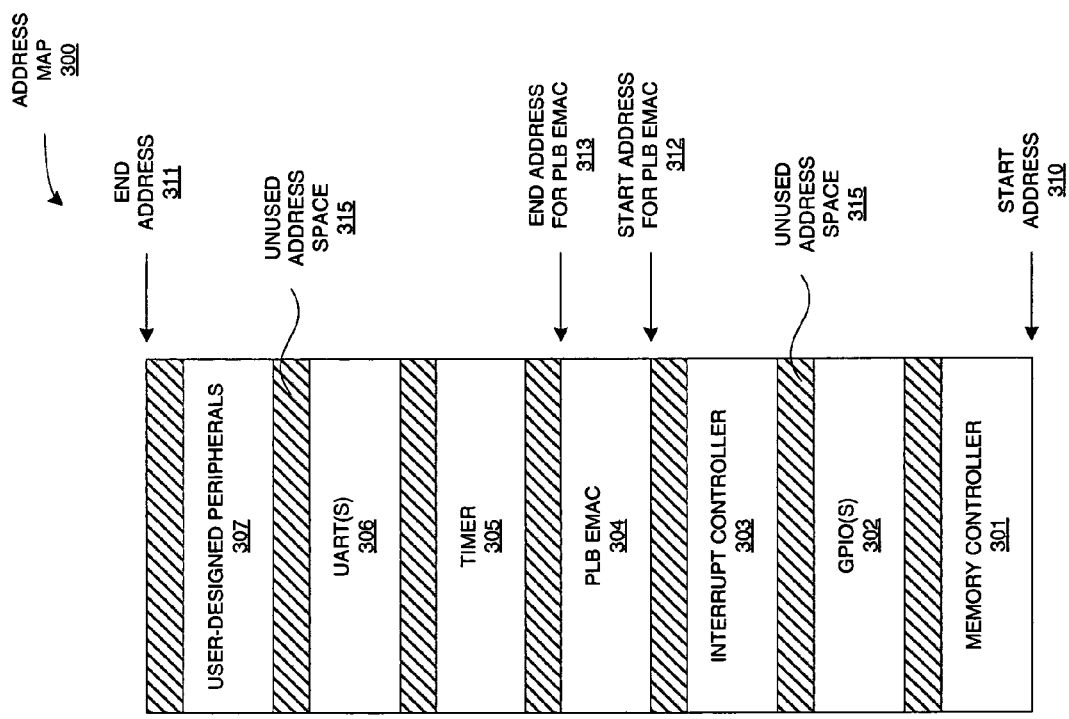
FIG. 3 is a high-level diagram depicting an exemplary embodiment of an address map which may be output from the address mapping flow of FIG. 2.

FIG. 3 is a high-level diagram depicting an exemplary embodiment of an address map 300 which may be output from address mapping flow 200 of FIG. 2. Notably, address map 300 is provided for purposes of clarity by way of example and not limitation, and any actual address map output will be dependent in part upon the types and number of peripherals in a user system design, such as may be obtained at operation 202 of FIG. 2.

Address map 300 includes a start address 310 and an end address 311. Between such addresses, there are address spaces which may be associated with particular peripherals. For example, address space 301 may be associated with a memory controller to control external memory. Address space 302 may be associated with one or more GPIOs. Address space 303 may be associated with an interrupt controller. Address space 304 may be associated with an Ethernet Media Access Controller ("EMAC") for coupling to a PLB. Accordingly, there may be a start address 312 and an end address 313 for address space 304. Address space 305 may be associated with a timer, and in this example, timer address space 305 is associated with an instantiated processor, such as a Micro Blaze processor. Address space 306 may be associated with one or more UARTs. Address space 307 may be associated with one or more user-defined peripherals. Notably, there may be unused address spaces 315, as generally indicated by cross-hatched lines between the above-mentioned address spaces, as well as at the top of address map 300. These unused address spaces 315 may be associated with addresses not used but available for subsequent assignment. For example, if a user system design is changed to add a peripheral, the static address spaces that may be available for that peripheral would be part of what was previously an unused address space. Furthermore, unused address space 315 may include gaps in addressable address ranges to provide subsequent compatibility with later developed peripherals for static address assignment.

Figure 4:
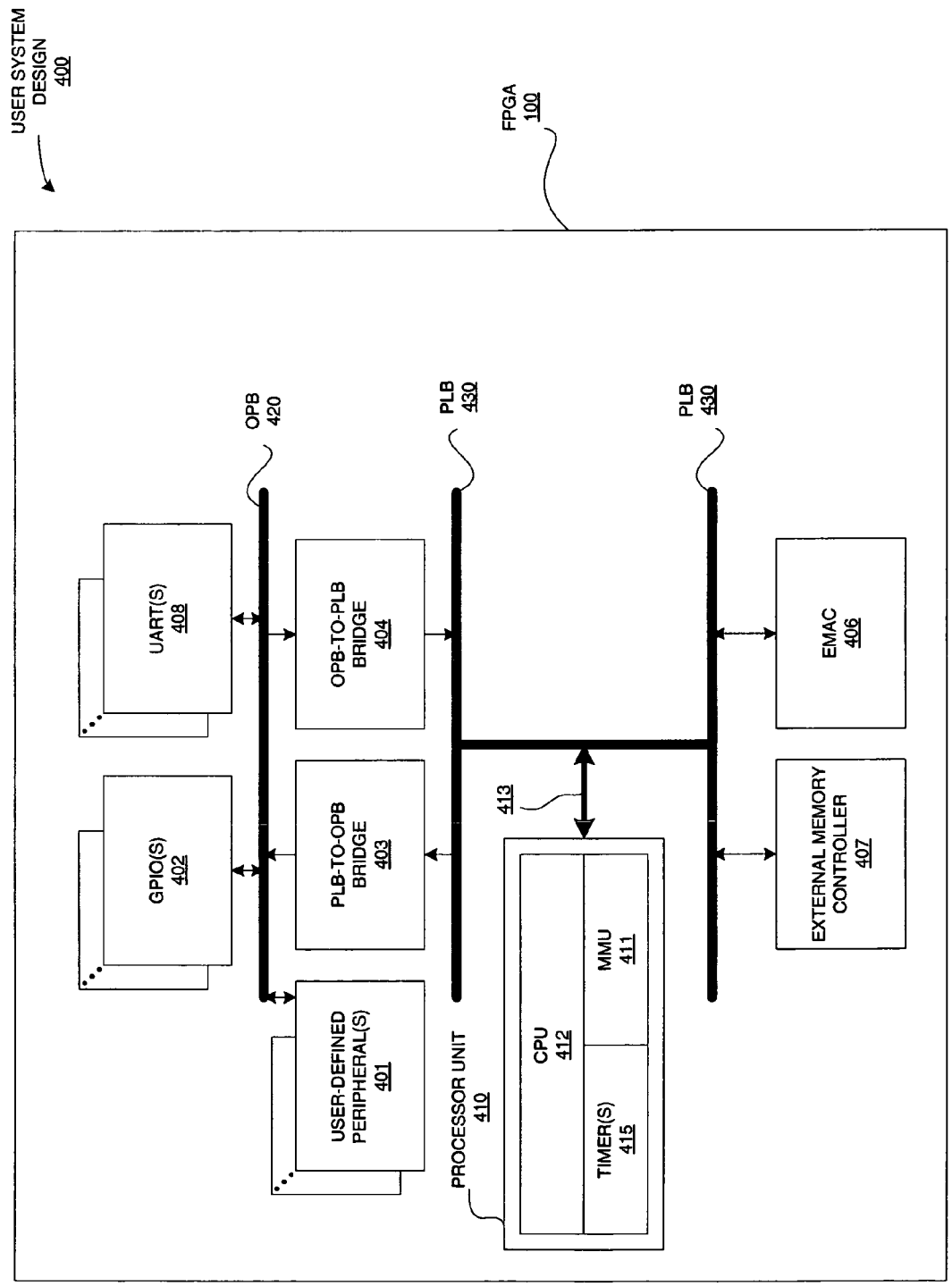
FIG. 4 is a high-level block diagram depicting an exemplary embodiment of a user system design.

FIG. 4 is a high-level block diagram depicting an exemplary embodiment of a user system design 400. Notably, an example is provided for purposes of clarity and not limitation, and thus the components that may be implemented in a user system design may vary from the peripherals illustratively shown. In this embodiment, there is an embedded processor unit 410. Processor unit 410 may include a set of timers 415, a central processing unit ("CPU") 412, and a memory management unit ("MMU") 411. Processor unit 410 may be wired via busing 413 to PLB 430. Although known elements of processor unit 410 which are not addressable via static addressing as described herein are illustratively shown, it should be appreciated that other known non-addressable elements of a user system design 400 have been omitted for purposes of clarity.

Responsive to address mapping, static addresses may be assigned for accessing external memory controller 407 and EMAC 406 via PLB 430. Additionally, static addresses may be assigned for communicating between PLB 430 and OPB 420 via PLB-to-OPB bridge 403 and OPB-to-PLB bridge 404. Furthermore, static addresses may be assigned for communicating with one or more user-defined peripherals 401 via OPB 420. Additionally, one or more GPIOs may be assigned static addresses for communication via OPB 420, and one or more UARTs 408 may be assigned static addresses for communication via OPB 420. Accordingly, it should be appreciated that processor unit 410 may be put in communication with one or more peripherals via one or more buses responsive to implementing an address map having static addresses.

Figure 5:
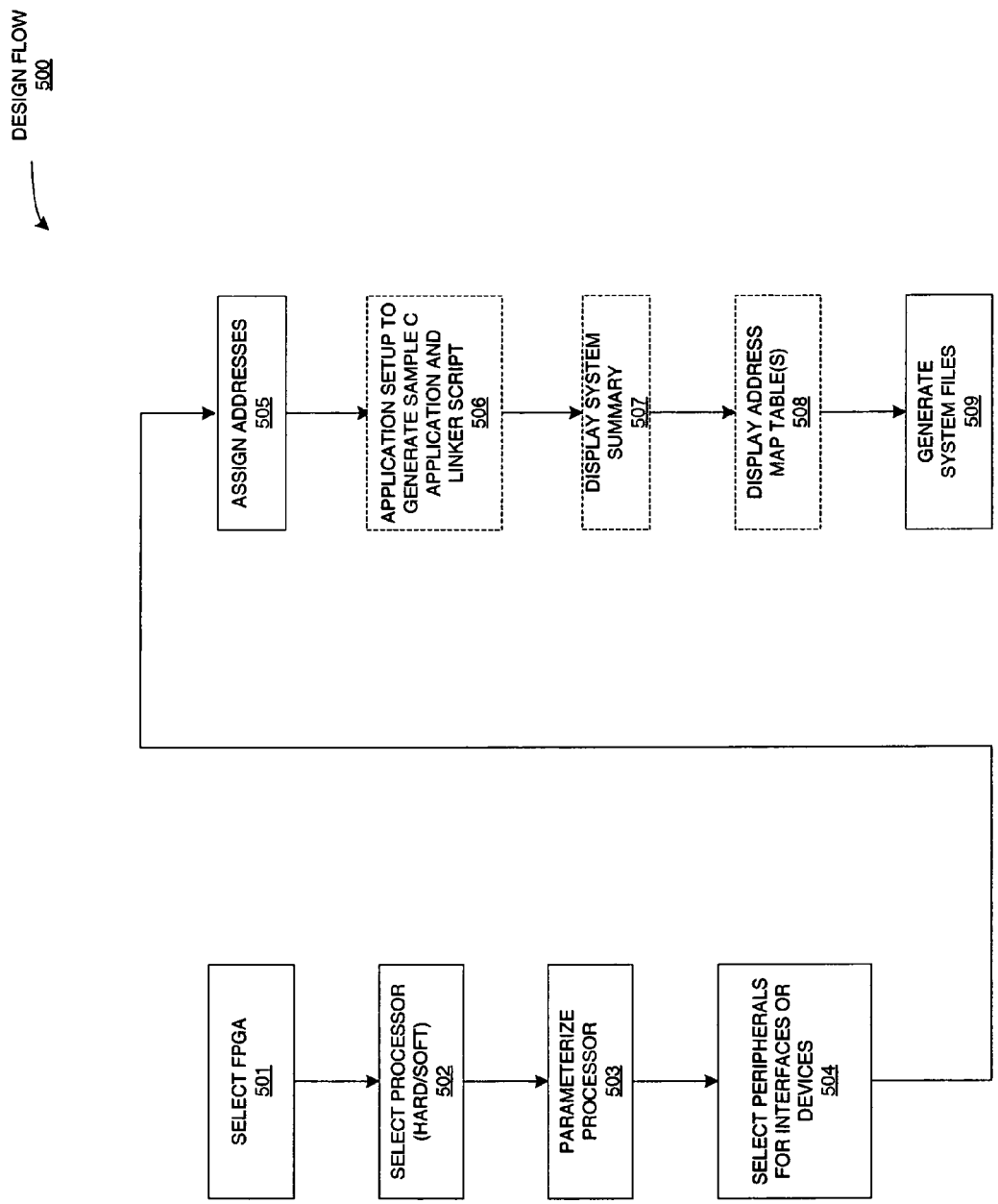
FIG. 5 is a flow diagram depicting an exemplary embodiment of a design flow for address mapping with static addresses.

FIG. 5 is a flow diagram depicting an exemplary embodiment of a design flow 500 for address mapping with static addresses. At 501, a type of FPGA is selected. At 502, a processor, namely either a hard or soft processor, is selected. FPGA and processor may be selected using a Base System Builder utility within Xilinx Platform Studio software tool available from Xilinx, Inc. of San Jose, Calif.

At 503, one or more parameters for the selected processor are themselves selected. Parameters which may be selected for a processor include the clock frequency of the processor, the clock frequency of the OPB, whether polarity is active high or low, and whether cache is activated or not, among other known processor configurable parameters.

At 504, peripherals are selected for input, output, or input/output interfaces or devices. For example, the type and size of external memory and whether SPI is used for accessing a system Electrically Erasable Programmable Read-Only Memory ("EEPROM") may be selected along with an associated peripheral for each. The selected peripheral may facilitate communication with the interface or device. Examples of other interfaces or devices include a PCI arbiter, a PCI bridge, a System ACE Compact Flash memory, and an IIC bus, among others.

At 505, static addresses are assigned to peripherals to be implemented. Thus, for example, PLB peripherals have static addresses assigned to them, OPB peripherals have static addresses assigned to them, and, for Power PC core, any DCR bus peripherals have static addresses assigned to them. Notably, for a soft processor there may not be any PLB or DCR bus, but only an OPB.

Optionally at 506, a sample application, such as in the C language, and a linker script may be set up for generation responsive to a user's selection. Such a sample application and linker script may be generated using a Base System Builder utility within Xilinx Platform Studio software tool available from Xilinx, Inc. of San Jose, Calif. This application set-up may include selecting one or more system input and output devices, such as one or more UARTs for input and one or more UARTs for output. Moreover, memory devices for instructions, data, and stack/heap may be selected. At 507 a system summary of the user input may be displayed for confirmation of user inputs from operations 501 through 506.

At 508, an address map table or tables may be displayed responsive to the address assignments made at 505. Such tables may be used by a user to confirm base and high addresses assigned to each peripheral according to a core name of such peripherals, including an instance name associated therewith. Notably, another utility, namely "Add/Edit Cores", in the software tool called Platform Studio ("XPS") from Xilinx, Inc., of San Jose, Calif., may be used to modify/override default assigned static addresses after 509. At 509, a user may select a button to generate system files to implement the design in the PLD with the assigned static addresses.

Figure 6B:
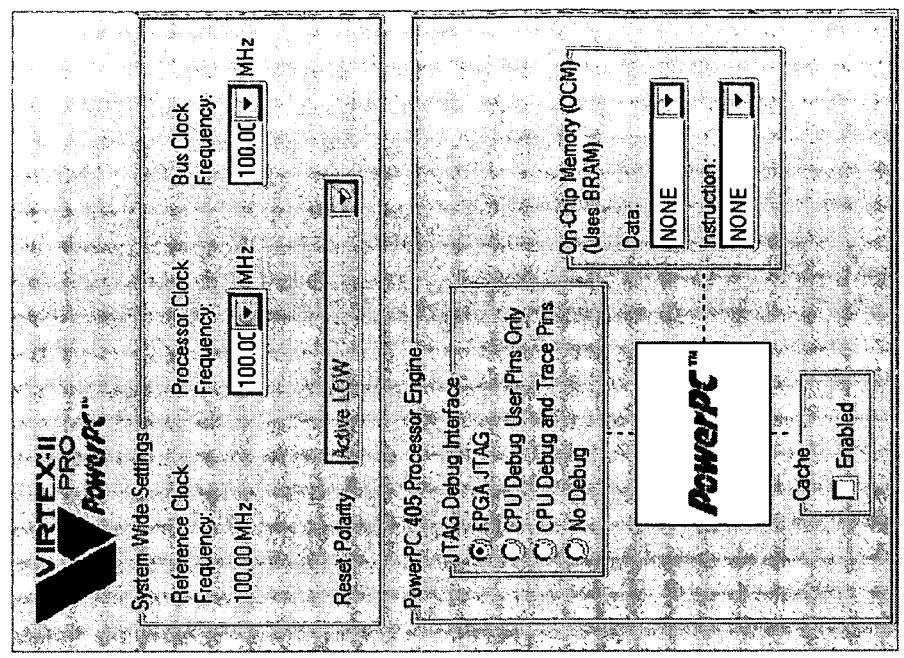
Figure 6A:
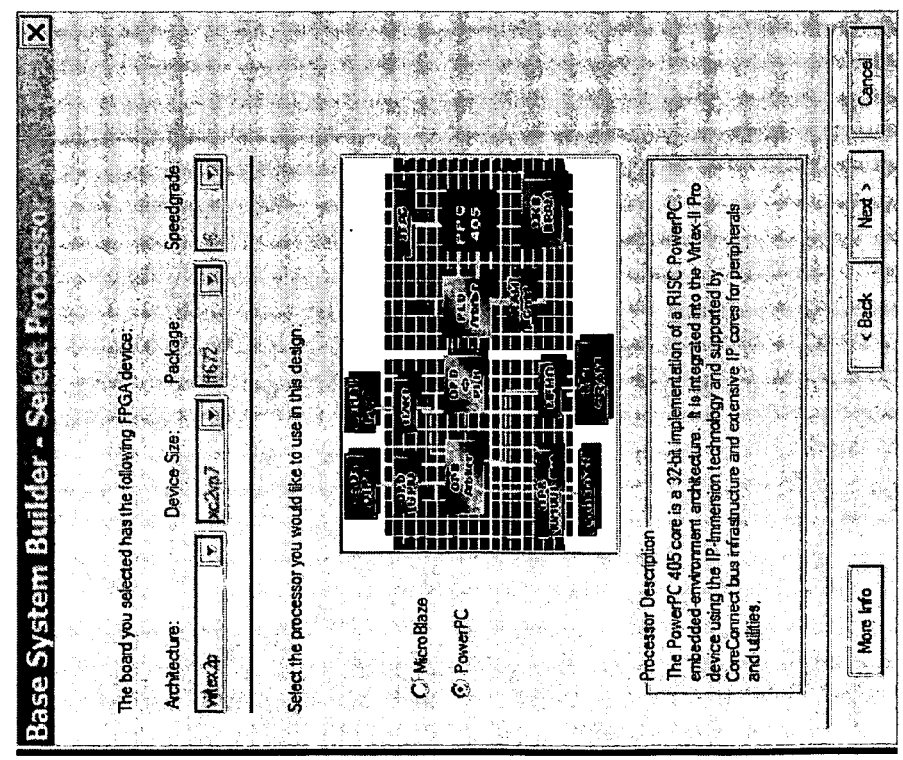

FIG. 6A is a screen-capture diagram depicting an exemplary embodiment of the Base System Builder ("BSB") graphical user interface ("GUI") 611. GUI 611 may be associated with operations 501 and 502 of FIG. 5.

FIG. 6B is a screen-capture diagram depicting an exemplary embodiment of "BSB" GUI 612. GUI 612 may be associated with operation 503 of FIG. 5.

Figures 6C-1, 6C-2:
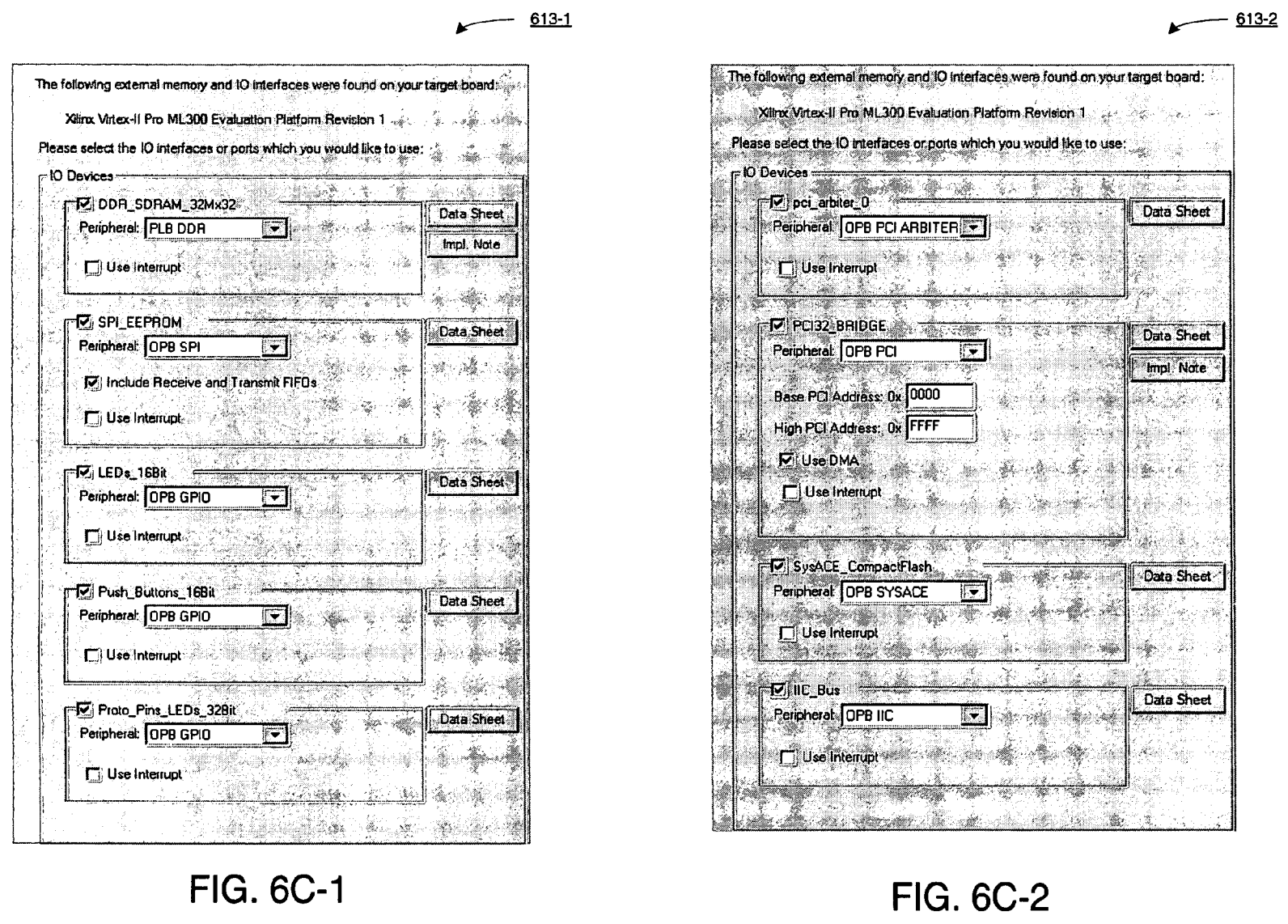

FIGS. 6C-1 and 6C-2 are screen-capture diagrams depicting respective exemplary embodiments of GUIs 613-1 and 613-2. GUIs 613-1 and 613-2 may be associated with operation 504 of FIG. 5.

Figure 6D:
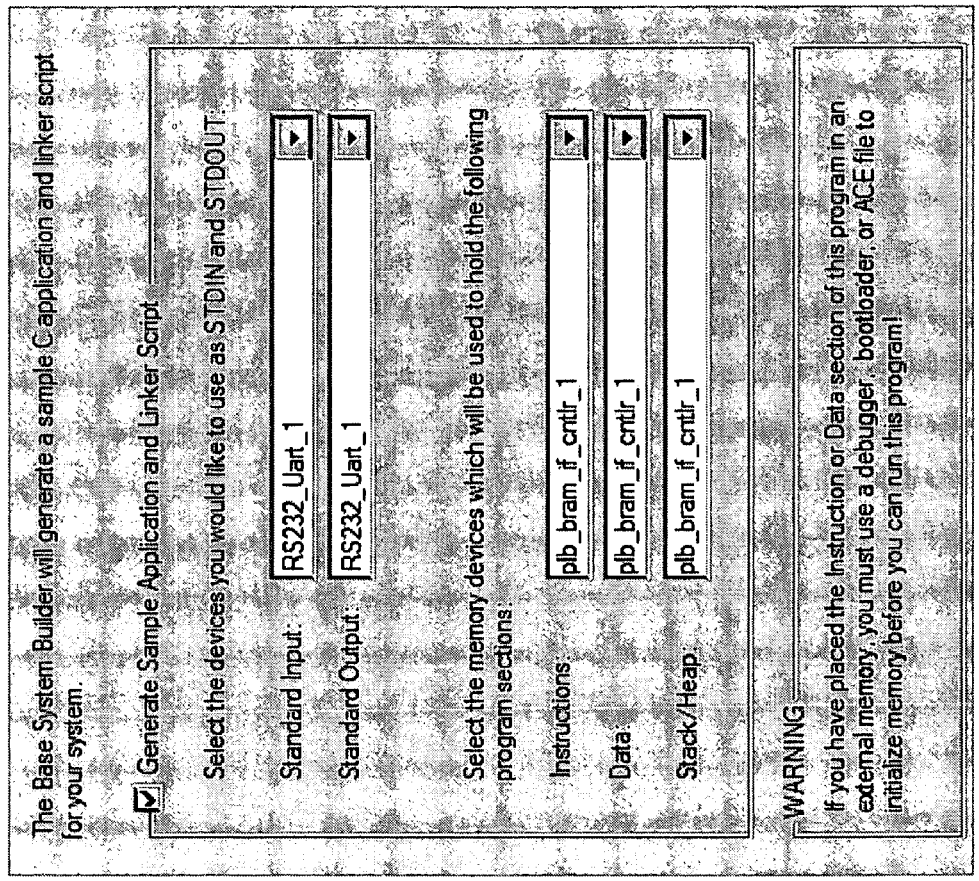

FIG. 6D is a screen-capture diagram depicting an exemplary embodiment of a GUI 614. GUI 614 may be associated with operation 506 of FIG. 5.

Figure 6E:
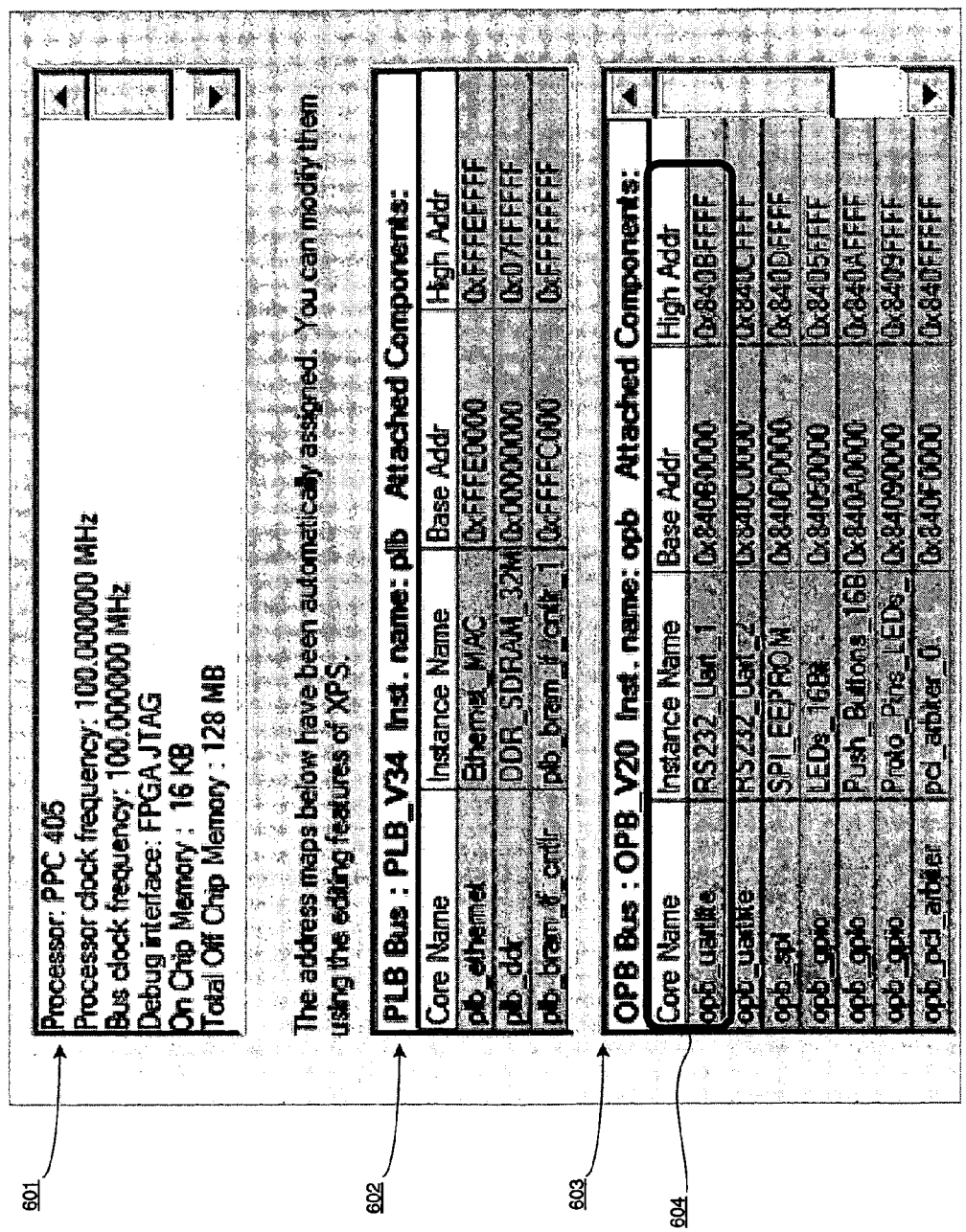

FIG. 6E is a screen-capture diagram depicting an exemplary embodiment of a GUI 600. GUI 600 may be associated with operations 507 and 508 of FIG. 5. GUI 600 may include a system summary window 601.

GUI 600 may include PLB and OPB screens 602 and 603, respectively, which may be associated with operations 505 and 508 of FIG. 5. In each of screens 602 and 603, a core name, instance name, base address, and high address for each peripheral in a design may be listed, such as example 604. In other words, screens 602 and 603 are address maps having base and high addresses automatically assigned. Notably, such addresses may be modified by a user, such as with an editing feature of XPS. Though two screens have been delineated, namely one for a V34 PLB and one for a V20 OPB, a single screen listing all peripherals may be provided. Thus, creation of address map tables as shown in screens 602 and 603 may be done at operation 508 of FIG. 5.

A generate button (not shown) may be selected to generate system files in association with such base and high addresses listed in screens 602 and 603. Notably, in screen 603, the UART block may be connected to specific pins on the PLD so as to access the corresponding external devices or connectors, such as a Serial port connector which may be on the PCB.

Notably, the respective screen-capture diagrams of FIGS. 6A, 6B, 6C-1, 6C-2, 6D, and 6E are merely one example in continuance of the example of an FPGA, where a BSB utility of the XPS software tool from Xilinx, Inc. of San Jose, Calif., was employed. Accordingly, it should be understood that other types of implementations may be used without departing from the scope of this disclosure. For example other known software tools for building a system in on FPGA platform may be used. Another example is using XPS's Add/Edit Core feature, with which a user may individually assemble or edit system components. Accordingly, address assignment of static addresses may be employed as described herein as an address generator for XPS. In XPS, default values for a peripheral may be modified by a user such that the user entered parameters override associated default parameters. User assigned values may be stored in files derived from peripheral core static files having default values installed, such static files may be resident as part of an EDK installation. Notably, after a user modifies a static file to provide a user-defined peripheral core file, the user-defined peripheral core file may automatically be used instead of the static file associated therewith. Thus, at 504, a user may modify one or more static files to provide one or more associated user-defined peripheral core files which may be included as one or more custom peripheral cores as described elsewhere herein but in this example replace predefined peripheral core files. Alternatively, a user may edit the static files themselves from which an address generator routine reads default address maps.

Figure 7:
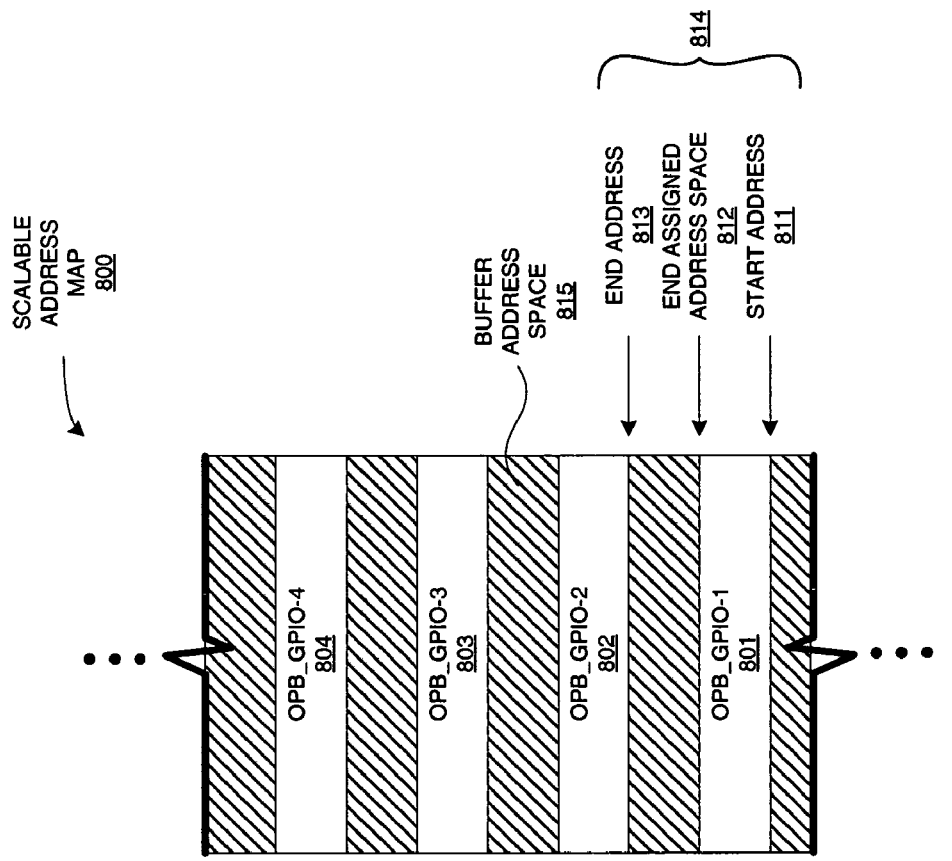
FIG. 7 is a high-level block diagram depicting an exemplary embodiment of a scalable address map for multiple instantiations of the same type of peripheral.

FIG. 7 is a high-level block diagram depicting an exemplary embodiment of a scalable address map 800 having multiple static address ranges for the same type of peripheral. Scalable address map 800 is illustratively shown only for OPB GPIO-1 through OPB GPIO-4, though it should be appreciated that other GPIOs as well as other peripherals may be included in scalable address map 800. In particular, for OPB GPIO-1 801, there is an associated address range 814 having a start address 811 and an end address 813. Notably, there may be unused address space within addressable range 814. Thus, an end of assigned address space 812 may or may not coincide with end address 813. This unused address space, such as between used address spaces of OPB GPIO-1 through OPB GPIO-4 for used address spaces 801 through 804, may create respective buffer address spaces 815. Notably, address ranges 814 may be a set number for each OPB GPIO, or for each peripheral for that matter. This may facilitate addressing by a processor. An example of a fixed address block may be a 64K byte block.

With continuing reference to FIG. 7, it should be understood that not all address space allocated to a peripheral need be used. It should further be understood that because the peripheral may be enhanced at some later time, in order to ensure that that there is additional addressable space for such later-developed enhancements. For example, buffer address spaces 815 may be blocks of addressable space for subsequently enhanced peripherals that may require additional addressable space.

Figure 8:
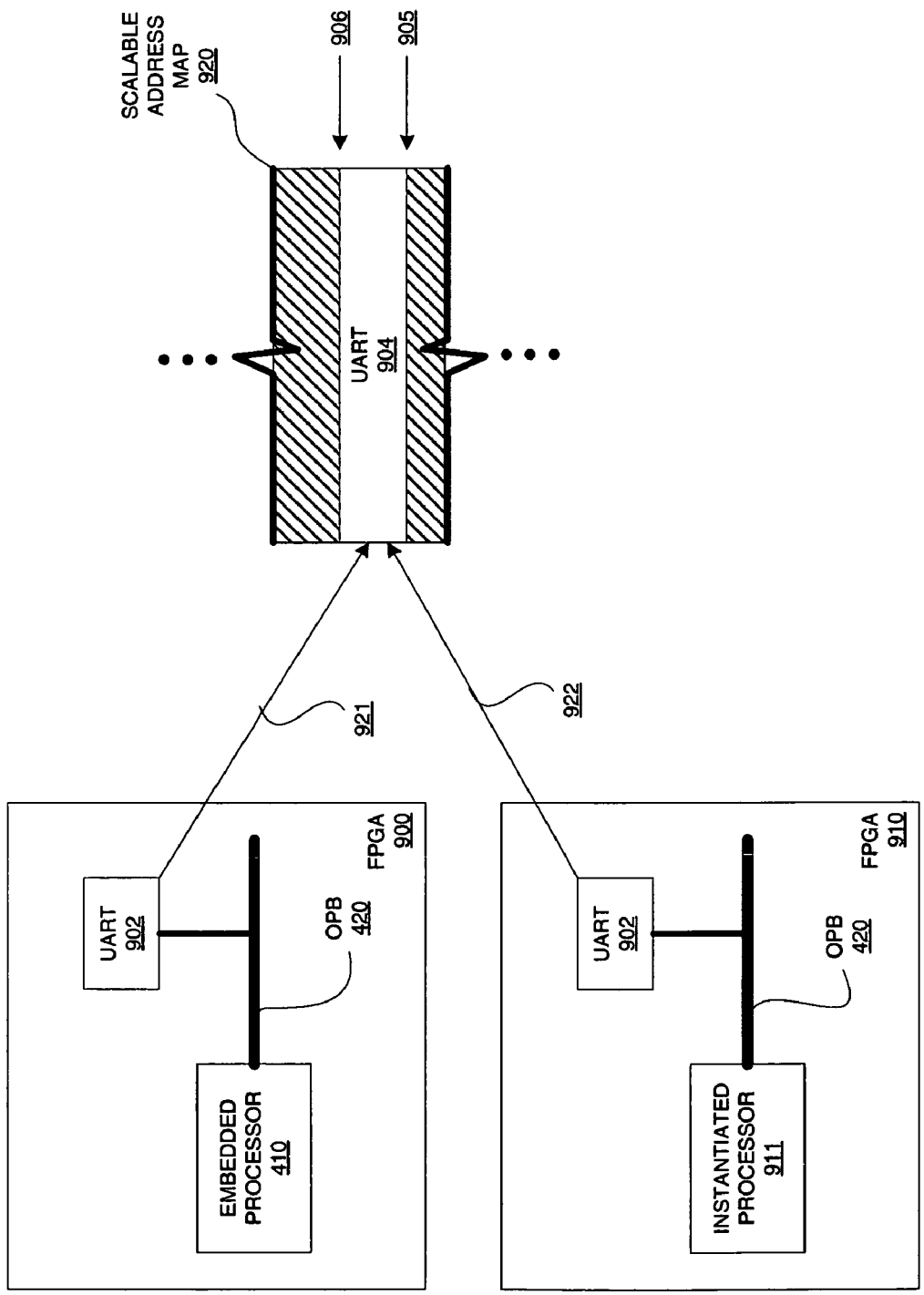
FIG. 8 is a block diagram depicting an exemplary embodiment of mapping of a Universal Asynchronous Receiver Transmitters ("UART") peripheral to the same address range for both embedded and instantiated processors.

FIG. 8 is a block diagram depicting an exemplary embodiment of mapping of a UART peripheral 902 to the same address range 904 for both an embedded processor 410 and an instantiated processor 911. More particularly, in the configuration of FPGA 900, an embedded processor 410 is coupled to UART 902 via OPB 420, and in the configuration of FPGA 910, an instantiated processor 911 is coupled to UART 902 via OPB 420.

UART 902 in both FPGA 900 and 910 configurations is mapped using static addresses in scalable address map 920 to UART address range 904 as generally indicated by solid-line arrows 921 and 922, respectively. Scalable address map 920 includes a static address range respectively defined by base static address 905 and high static address 906 for UART address range 904.

Notably, it should be appreciated that UART 902 as configured in FPGA 910 is the same as UART 902 in FPGA 900, and thus the same static addresses in scalable address map 920 may be used for both hard and soft processor configurations. Thus, it should be appreciated that two systems configured at different moments in time may yield identical address maps via address generation routine used for common components. Although the processors in these two different systems are themselves different, such processors may be same. Moreover, although the system buses in these two different systems are similar, such busses may be different. Regardless of same or different processors, buses, boards, FPGAs, versions of software to build a system, such as XPS, common peripherals may be consistently assigned the same static address slot. Notably, if there are multiple instances of the same type of peripheral, for example multiple UARTs, they may be sorted alphabetically by instance name (e.g., UART-1, UART-2, etc.) for respectively assigning a static address range to each.

Figure 9A:
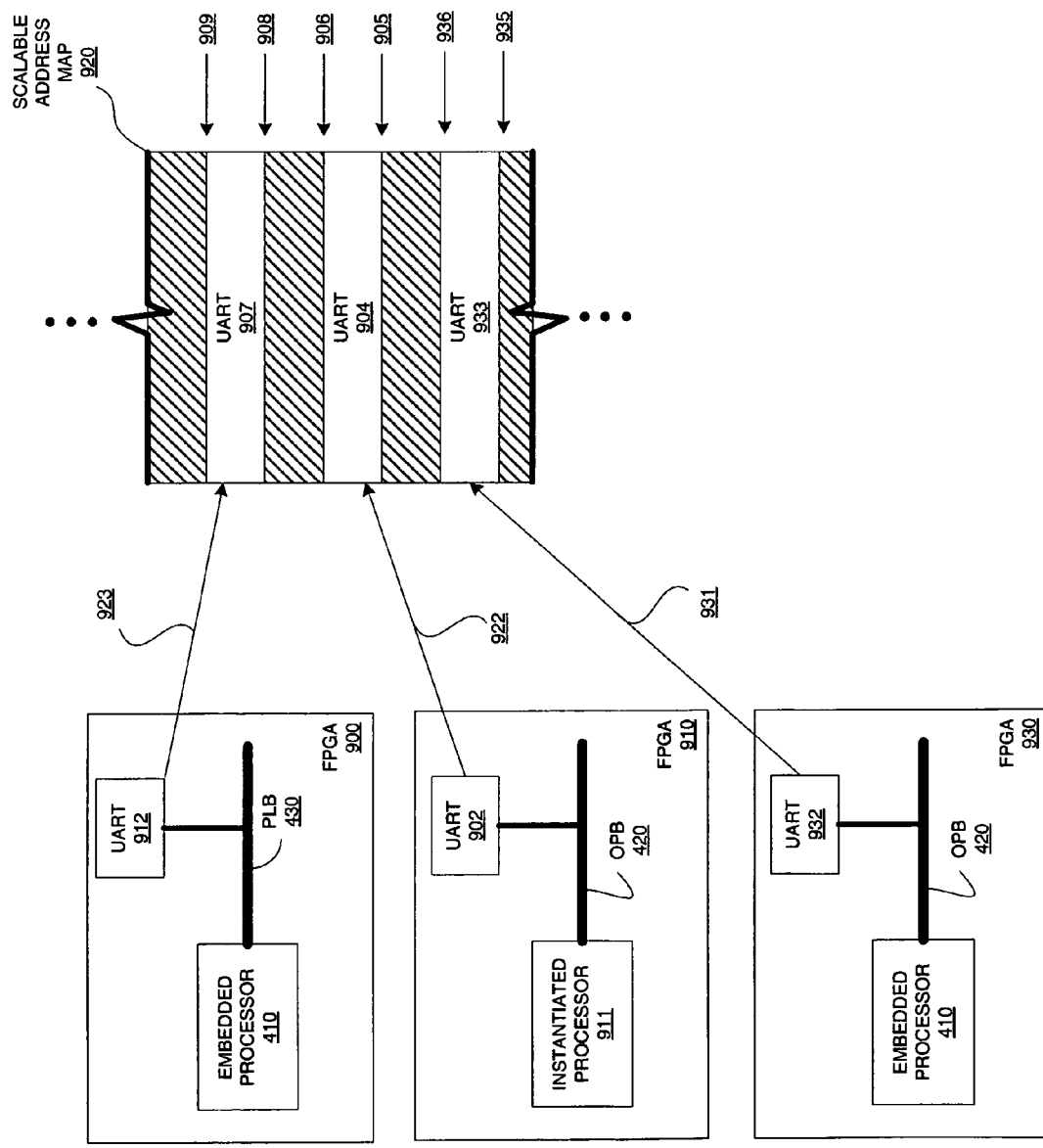
FIG. 9A is a block diagram depicting an exemplary embodiment of mapping to different address ranges of similar UART peripherals that are functionally equivalent but coupled to different system buses.

FIG. 9A is a block diagram depicting an exemplary embodiment of mapping to the different address ranges of similar UART peripherals that are functionally equivalent but coupled to different system buses. FIGS. 8 and 9A are the same except that in FIG. 9A, embedded processor 410 is illustratively shown coupled to a PLB UART 912 via PLB 430, and UART 912 is mapped to a different UART address range, namely UART address range 907 with a base address 908 and a high address 909 as illustratively shown as being included in scalable address map 920. For purposes of illustration of different configurations, FPGA 930 having a UART 932 is illustratively shown coupled via an OPB 420 to embedded processor 410. UART 932 may be mapped to another UART address range, namely UART address range 933 with a base address 935 and a high address 936 as illustratively shown as being included in scalable address map 920. In this example, PLB UART 912, OPB UART 902, and OPB UART 932 by default go to different address ranges, namely respectively UART address ranges 907, 904, and 933 as indicated by respective solid-line arrows 923, 922, and 931. Thus, it should be appreciated that peripherals coupled to different or same buses may be mapped to different static address ranges by default, even though they may be functionally equivalent peripherals. Notably, UARTs 902 and 932 may be the same even though they may be coupled to different types of processors.

With regard to FIGS. 8 and 9A, it should be understood that absent user override, any instance of a peripheral, such as a UART for example, is always assigned the same address range for that type of UART. Thus, if a user instantiates multiple UARTs in a single design, each UART will follow a predictable and deterministic path for address slot generation absent user override. However, functionally equivalent peripherals can occupy the same address range responsive to user override of a default assignment of static addresses.

Figure 9B:
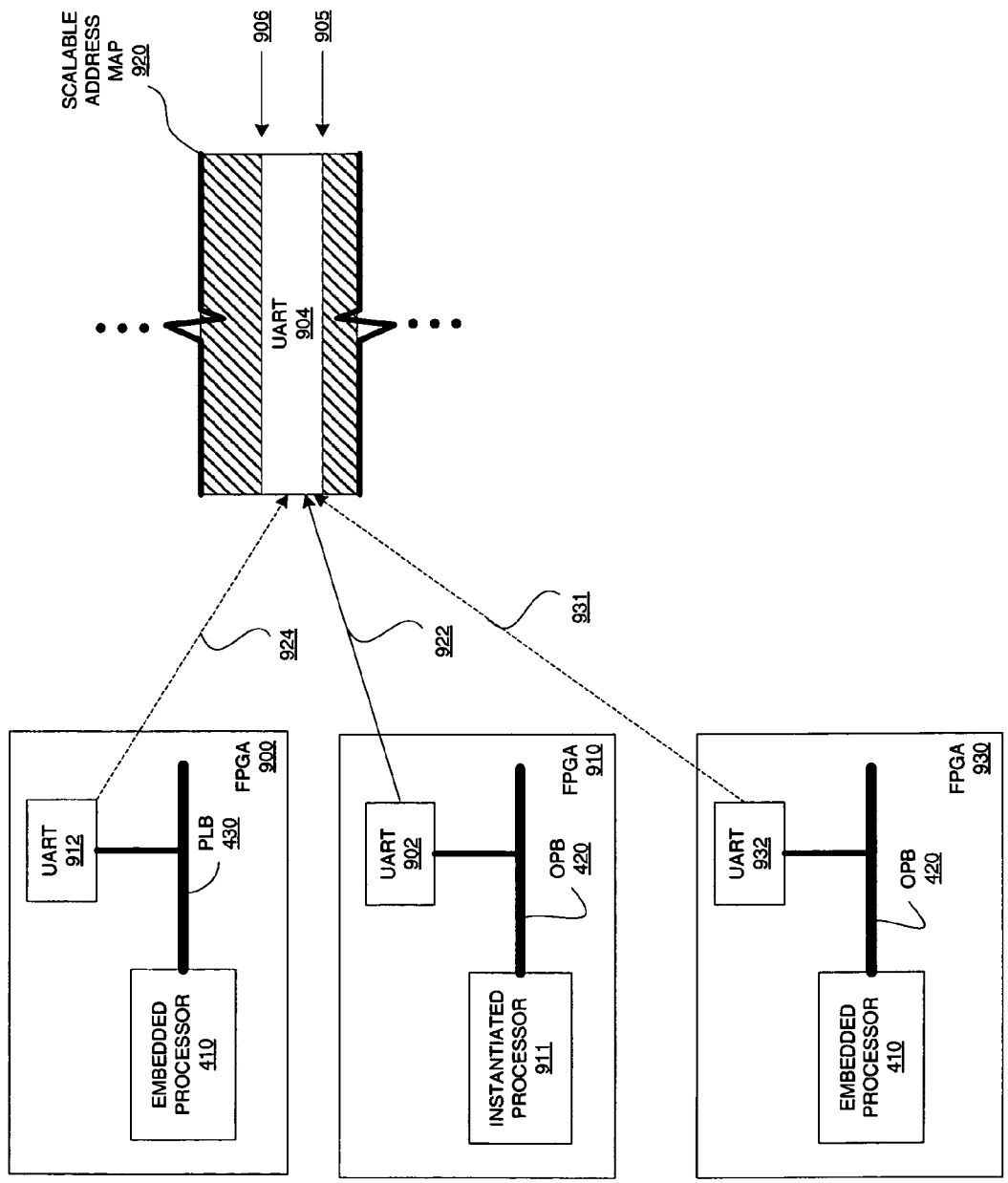
FIG. 9B is a block diagram depicting an exemplary embodiment of mapping to the same address range of similar UART peripherals that are functionally equivalent but coupled to different system buses.

Thus, alternatively for example, in FIG. 9B there is shown a block diagram depicting an exemplary embodiment of mapping to the same address range of same or similar UART peripherals that are functionally equivalent but coupled to same or different system buses. FIGS. 8 and 9B are the same except that in FIG. 9B, embedded processor 410 is illustratively shown coupled to a PLB UART 912 via PLB 430, and another FPGA configuration, namely FPGA 930 of FIG. 9A has been added. However, UART peripherals 902, 912 and 932 are illustratively shown mapped to UART address range 904 of scalable address map 920, as generally indicated by solid-line arrow 922 for UART 902 and dashed-line arrows 924 and 931 for UARTs 912 and 932, respectively. Arrows 924 and 931 are dashed in FIG. 9B to indicate that this is a user invoked option.

Thus, with reference to FIGS. 9A and 9B, three example configurations of FPGAs have been illustratively shown, namely with an embedded processor PLB coupling, with an embedded processor OPB coupling, and with an instantiated processor OPB coupling. From these examples, it should be understood that an embedded processor may have both a PLB and OPB coupling for a UART, and address mapping for such coupling may be to same or different address spaces for the same embedded processor. More generally, with reference to FIGS. 9A and 9B, it should be appreciated that an FPGA may have a same or different processor coupled to a UART via a same or different bus and mapped to a same or different address location.

Figure 10:
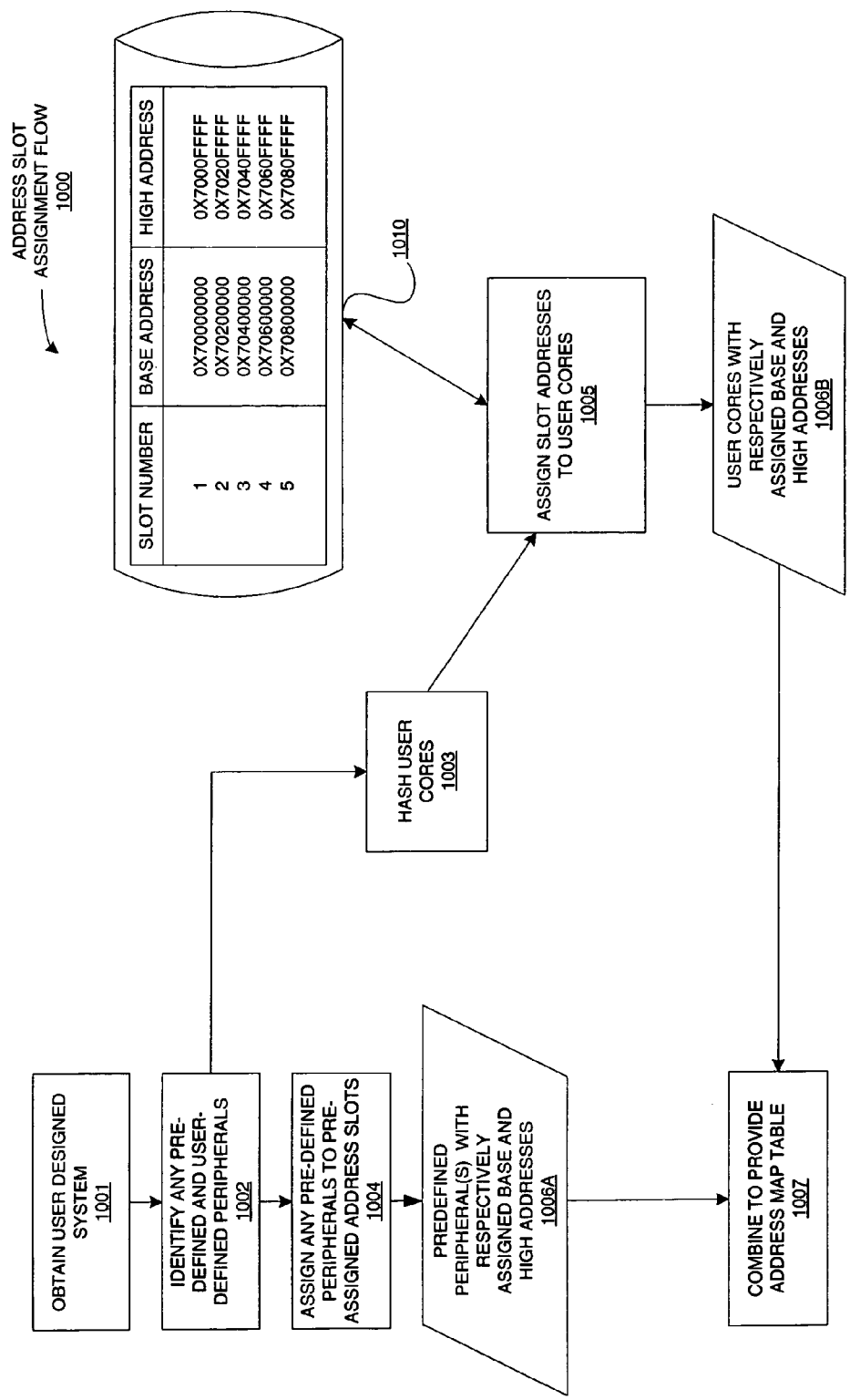
FIG. 10 is a high-level flow diagram depicting an exemplary embodiment of an address slot assignment flow.

FIG. 10 is a high-level flow diagram depicting an exemplary embodiment of an address slot assignment flow 1000. Address slot assignment flow 1000 may be used for operation 505 of FIG. 5.

At 1001, a user designed system is obtained. At 1002, any pre-defined and user-defined peripherals in the user designed system are identified. Notably, this flow assumes that a user design will have at least one pre-defined and at least one user-defined peripheral, though in implementation there may not be both types of peripherals. At 1004, all identified pre-defined peripherals are assigned static addresses according to predefined address slots therefore. Such predefined address slots may be stored in data files in EDK software. According, at least a portion 1006A of the output of address slot assignment flow 1000 from assignment at 1004 may be one or more predefined peripherals each with a respectively assigned base and high static address pair.

At 1003 any user-defined peripherals ("user cores") identified at 1002 are respectively hashed. Notably, a known hash function with an extremely low probability of collision may be used. Output of each user core hashed is a number, namely a slot number. A slot number will vary according to user core. A database 1010 including slot numbers in association with base and high address pairs is accessible for respectively assigning pairs of slot addresses to each user core identified at 1002. More particularly, by way of example and not limitation, if the output of a hashed user core in this example was the number value 2, then a base address and a high address for slot 2 in database 1010 would be accessed and assigned at 1005. Accordingly, another portion 1006B of the output of address slot assignment flow 1000 from assignment of slot addresses at 1005 may be each identified user core with associated assigned base and high addresses.

At 1007, assigned address pairs from 1006A and 1006B may be combined to provide an address map table composed of user-defined and predefined peripherals. Thus, it should be appreciated that each predefined peripheral may have a different slot number from every other peripheral, and each user-defined peripheral may have a different slot number from every other peripheral responsive to hashing. Accordingly, each instance of a type of a user-defined peripheral may hash to a particular slot number, such that every invocation of that type and instance of the user-defined peripheral is always assigned the same static base and high address pair.

Figure 11:
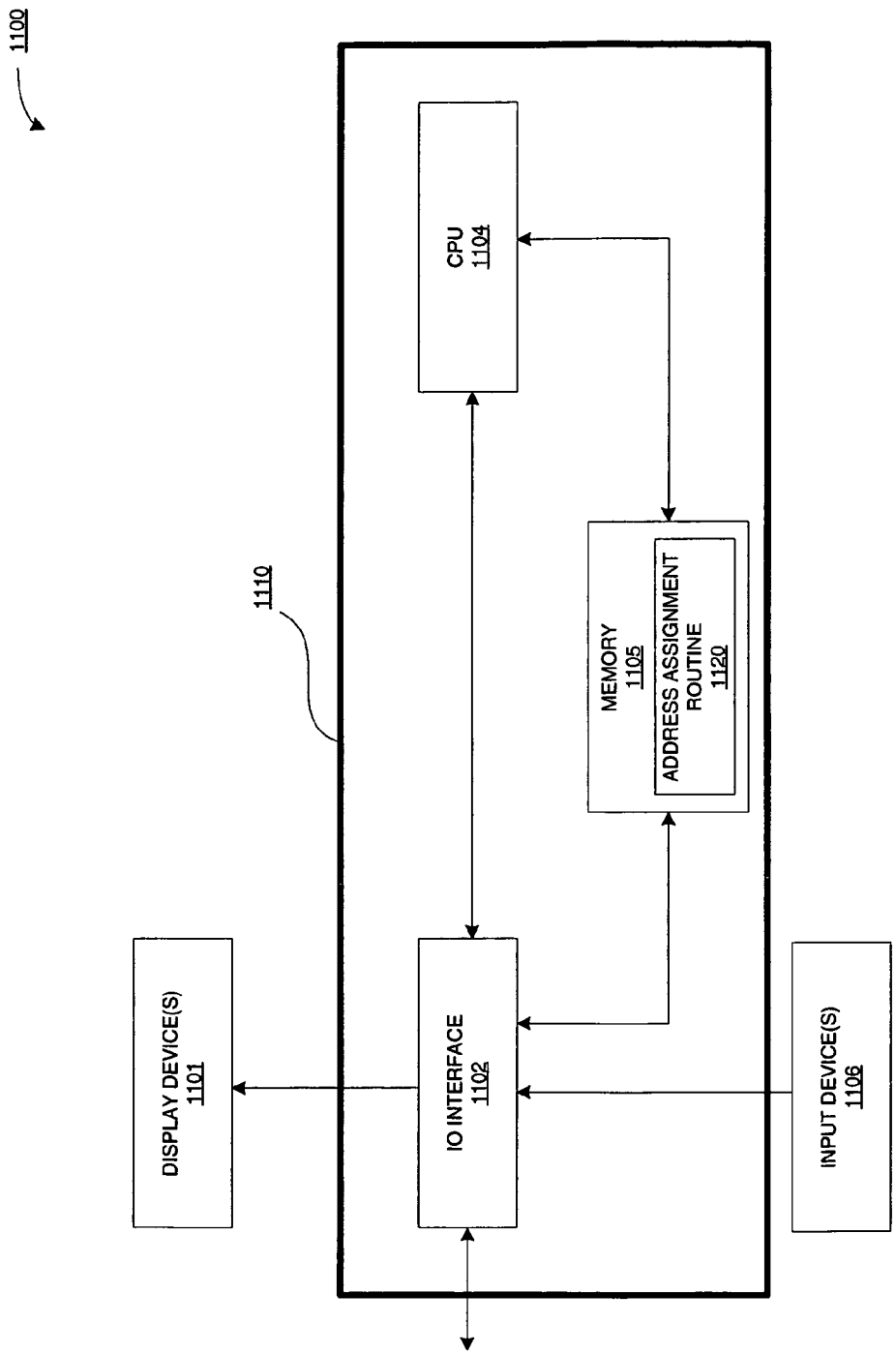
FIG. 11 is a high-level block diagram depicting an exemplary embodiment of a computer system.

FIG. 11 is a high-level block diagram depicting an exemplary embodiment of a computer system 1100. Computer system 1100 may include a programmed computer 1110 coupled to one or more display devices 1101, such as Cathode Ray Tube ("CRT") displays, Plasma displays, and Liquid Crystal Displays ("LCD"), and to one or more input devices 1106, such as a keyboard and a cursor pointing device. Other known configurations of computer system 1100 may be used.

Programmed computer 1100 may be programmed with a known operating system, which may be OS/2, System 7, Java Virtual Machine, Linux, Solaris, Unix, or a Windows operating system, among other known platforms. Programmed computer 1100 includes a central processing unit (CPU) 1104, memory 1105 and an input/output ("IO") interface 1102. CPU 1104 may be a type of microprocessor known in the art, such as available from International Business Machines ("IBM"), Intel, and Advanced Micro Devices for example. Support circuits (not shown) may include conventional cache, power supplies, clock circuits, data registers, and the like.

IO interface 1102 may include chip set chips, graphics processors, and daughter cards, among other known circuits. An example of a daughter card may include a network interface card ("NIC"), a display interface card, a modem card, and a Universal Serial Bus ("USB") interface card, among other known circuits. Thus, IO interface 1102 may be coupled to a conventional keyboard, network, mouse, display printer, and interface circuitry adapted to receive and transmit data, such as data files and the like. Notably, programmed computer 1110 may be coupled to a number of client computers, server computers, or any combination thereof via a conventional network infrastructure, such as a company's Intranet and/or the Internet, for example, allowing distributed use for interface generation.

Memory 1105 may be directly coupled to CPU 1104 or coupled through IO interface 1102. Memory 1105 may store all or portions of one or more programs or data to implement processes in accordance with one or more aspects of the invention to provide address assignment routine 1120 for assignment of addresses as described elsewhere herein. Additionally, those skilled in the art will appreciate that one or more aspects of the invention may be implemented in hardware, software, or a combination of hardware and software. Such implementations may include a number of processors independently executing various programs and dedicated hardware or programmable hardware.

At least a portion of an operating system may be disposed in memory 1105. Memory 1105 may include one or more of the following: random access memory, read only memory, magneto-resistive read/write memory, optical read/write memory, cache memory, magnetic read/write memory, and the like, as well as signal-bearing media as described below.

One or more program(s) of the program product peripheral mapping generator 1120, as well as documents thereof, may define functions of embodiments in accordance with one or more aspects of the invention and can be contained on a variety of signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Furthermore, such signal-bearing media may be in the form of a carrier wave or other signal propagation medium via a communication link for streaming information, including downloading all or a portion of a computer program product. Such signal-bearing media, when carrying computer-readable instructions that direct functions of one or more aspects of the invention, represent embodiments of the invention.

Thus it should be appreciated that variability from design to design may be reduced by assigning the same addresses in each design for predefined or user-defined peripherals. Though the static addresses may be overridden by a user, variability provided via a PLD by assignment of static addresses may be controlled. In other words, it should be understood that though a PLD has variability, such variability may not always be what a user desires for implementing a design. Thus, by having addresses in the same place in each design with respect to predefined user-defined peripherals, a software application program running on the processor coupled with similar peripherals, may work on a different board/device without recompiling the software application. An example binary format for a software application running on an embedded processor is an Executable and Linkable Format ("ELF") file. Accordingly, address maps may therefore stay consistent across a user's choice of processor, choice of circuit board, choice of bus, choice of FPGA, and choice of software version used to implement a design.

It should be appreciated that by maintaining the hardware design for instantiation in a PLD responsive to address mapping as described herein, software associated with operating the design may not have to be adjusted when porting the design from one platform to another. In other words, inter-operability is facilitated because each peripheral address space listed in a software application developer may write in to the code, for example, accessing a predefined peripheral, need not change from one version of hardware to another. Thus, porting of applications across processors is facilitated, as such processors may share a same address map subject to having the same types of buses and peripherals employed.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, although a PLB, an OPB, and a DCR bus are examples of associated bus protocols to which peripherals may be configured to comport, other known buses or bus protocols may be used. Accordingly, static address assignment as described herein is not limited to any specific bus protocol or protocols. Furthermore, it should be appreciated that as such bus protocols evolve or new bus protocols develop, static address assignment may be facilitated in accordance with a study of this disclosure. Claim(s) listing steps do not imply any order of the steps. Trademarks are the property of their respective owners.

What is claimed is:

1. A method for generating an address map, comprising:
obtaining predetermined static addresses;
obtaining a system design for implementation in an integrated circuit, the system design including a processor internal to the integrated circuit;
the predetermined static addresses being predetermined independently of the system design;
identifying at least one predefined circuit block in the system design, the at least one predefined circuit block being for instantiating in configurable logic of the integrated circuit for coupling to the processor;
assigning to the at least one predefined circuit block a static address range, the static address range obtained from the predetermined static addresses for the processor to address the at least one predefined circuit block; and generating the address map for the system design having the at least one predefined circuit block with the static address range.

2. The method according to claim 1, wherein the static address range is assigned according to type and instance of the at least one predefined circuit block.

3. The method according to claim 2, wherein one of the types of buses is a processor local bus.

4. The method according to claim 3, wherein the at least one predefined circuit block is selected from a General Purpose Input/Output interface, a Universal Asynchronous Receiver Transmitter, a Gigabit Ethernet Media Access Controller, an Asynchronous Transfer Mode Controller, a Rapid Input/Output Low Voltage Differential Signaling interface, a Double Data Rate interface, and an External Memory Controller.

5. The method according to claim 1, wherein one of the types of buses is an on-chip processor bus.

6. The method according to claim 5, wherein the at least one predefined circuit block is selected from a General Purpose Input/Output interface, a Hard Wired Internal Configuration Access Port, a Universal Asynchronous Receiver Transmitter, an Inter-Integrated Circuit bus interface, a Serial Peripheral Interface, an Ethernet, an Asynchronous Transfer Mode Controller, an Interrupt Controller, a Microprocessor Debug Module, an External Memory Controller, a System Advanced Configuration Environment, a timer, a Direct Memory Address interface, an analog-to-digital converter, a digital-to-analog converter, a Peripheral Component Interconnect, an on-chip processor bus interface, an on-chip processor bus-to-processor local bus bridge, a JTAG Universal Asynchronous Receiver Transmitter, an on-chip processor bus arbiter, and a High-Level Data Link Controller.

7. The method according to claim 1, wherein one of the types of buses is a device control register bus.

8. The method according to claim 7, wherein the at least one predefined circuit block is selected from an instruction-side on-chip memory controller, a data-side on-chip memory controller, a processor local bus-to-on-chip processor bus bridge, an on-chip processor bus-to-processor local bus bridge, a processor local bus interface, an instruction-side device control register interface, and a device control register interrupt controller.

9. The method according to claim 1, further comprising:
identifying at least one user-defined circuit block in the system design, the at least one user-defined circuit block being for instantiating in the configurable logic of the integrated circuit for coupling to the processor;
assigning to the at least one user-defined circuit block to another static address range, the other static address range obtained from the predetermined static addresses for the processor to address the at least one user-defined circuit block; and
generating the address map for the system design having the at least one user-defined circuit block with the other static address range.

10. The method according to claim 9, wherein the other static address range is assigned according to type and instance of the at least one user-defined circuit block.

11. The method according to claim 10, wherein the integrated circuit is a Field Programmable Gate Array.

* * * * *